United States Patent [19]

Ott et al.

[11] Patent Number: 4,851,662
[45] Date of Patent: Jul. 25, 1989

[54] REFRIGERATOR ICE DISPENSER LIGHT WITH PHOTOSENSITIVE SWITCH

[75] Inventors: Lester J. Ott, Swisher; Brian M. Midlang, Cedar Rapids, both of Iowa

[73] Assignee: Amana Refrigeration Inc., Amana, Iowa

[21] Appl. No.: 238,077

[22] Filed: Aug. 30, 1988

[51] Int. Cl.⁴ .............................................. H01J 40/14
[52] U.S. Cl. .............................. 250214 AL; 250/222.1
[58] Field of Search ............ 250/214 AL, 222.1, 221, 250/214 SW; 301/117

[56] References Cited

U.S. PATENT DOCUMENTS 2,274,774  3/1942  Chambers ................... 250/214 AL
3,476,943  11/1969  Bruce ......................... 250/214 AL
4,587,417  5/1986  Duve et al. ................. 250/214 AL
4,645,975  2/1987  Meitzler et al. ............ 250/214 AL Primary Examiner—Edward P. Westin
Assistant Examiner—Khaled Shami
Attorney, Agent, or Firm—William R. Clark; Richard M. Sharkansky

[57] ABSTRACT

A refrigerator ice dispenser light having a control including a photosensitive switch which applies half wave rectified line voltage when there is little or no ambient room light thereby dimly lighting the bulb at night. In response to the dispenser being activated, the photosensitive switch is shunted and line voltage is applied across the bulb.

8 Claims, 1 Drawing Sheet

REFRIGERATOR ICE DISPENSER LIGHT WITH PHOTOSENSITIVE SWITCH

BACKGROUND OF THE INVENTION

The field of the invention generally relates to a refrigerator having a through-the-door dispenser for ice, water, or the like, and more particularly the invention relates to a photosensitive control for illuminating a light bulb positioned in the recess of the dispenser.

Through-the-door ice and water dispensers are widely used in domestic refrigerators, especially those of the so-called side-by-side models. As is well known, there generally is a recess or a cavity in the front of the freezer door, and the glass to be filled in inserted into it. Upon depressing an actuator, the ice, water, or other cold drink is then dispensed directly into the glass without the necessity of opening the refrigerator door. Such method of obtaining ice or chilled liquid is very convenient, and also avoids opening the door and introducing heat into the interior of the refrigerator. Such dispensers are described, for example, in U.S. Pat. Nos. 3,798,923; 3,874,559; and 3,942,334.

Prior art dispensers have used a light bulb to illuminate the dispenser cavity so that it is easy to see when the glass is filled to the desired level with ice or liquid. Further, dispenser light bulbs have been coupled to the dispenser actuator so that the light bulb automatically comes on while ice or liquid is being dispensed, but otherwise is off. More specifically, it is common for ice dispensers to have a pivoted mechanism such as a lever arm against which the glass is pushed to open a small door covering the ice chute. Typically, the dispenser actuator switch is responsive to movement of the lever arm such that when the lever arm is depressed to open the door, the actuator switch is closed thereby actuating an ice auger that feeds ice down the chute. This same or a similarly mounted switch has also been used to turn the light bulb on so that activation of the dispensing apparatus automatically turns on the dispenser light.

Prior art refrigerators have also had an operator actuable toggle switch for the dispenser light bulb so that the bulb could be turned on and left on independent of dispensing. More specifically, it has been found to be a desirable feature to be able to turn the dispenser light bulb on at night so that anyone wanting ice or water during the night can easily find his way to the refrigerator in the dark without turning on the kitchen lights and subjecting his eyes to the brightness. It has been found that either by intent or inadvertence, refrigerator dispenser lights are often not turned off in the morning such that the light bulbs are left on continuously. It has been determined that when the light bulbs are continuously operated at household voltage, their mean life to failure (MLTF) is unsatisfactorily low. For example, a typical light bulb may have to be replaced every three or four months, and many customers find this unacceptable.

SUMMARY OF THE INVENTION

A primary object of the invention is to improve the mean life to failure of refrigerator dispenser light bulbs.

A further object is to increase the mean life to failure of such light bulbs, while still providing the feature of having the light bulb on at night so that one can find his way to the refrigerator without turning on the kitchen lights.

It is also an object to reduce the filament temperature of the light bulb when it is on at night, but still have maximum brightness when water or ice is being dispensed.

It is another object to energize the light bulb with 120 volts AC when ice or liquid is being dispensed, and otherwise energize the light bulb automatically at night and then at reduced voltage.

In a refrigerator having a door with a recess for dispensing water, ice or the like through the door, and the recess includes a dispensing actuator and a light bulb for illuminating the recess, a light bulb control in accordance with the invention comprises first switch means responsive to the absense of ambient light for automatically energizing the light bulb and second switch means responsive to the actuator for energizing the light bulb when ice or water is being dispensed. It may be preferable that the first switch means comprises a photosensitive switch. Also, it may be preferable that the first switch comprises an SCR. Further, switch means may be included for disabling the first switch means.

The invention may also be practiced in a refrigerator having a through-the-door dispenser with a door recess including a dispensing activator and a light bulb for illuminating the recess wherein a light bulb control comprises first switch means responsive to the actuator for applying line voltage across the light bulb and second switch means for applying half wave rectified line voltage across the light bulb, the second switch means comprising photosensitive means for closing the second switch in ambient darkness.

BRIEF DESCRIPTION OF THE DRAWINGS

The foregoing objects and advantages of the invention will be more fully understood with a reading of the Description of the Preferred Embodiment with reference to the drawings, wherein.

DESCRIPTION OF THE PREFERRED EMBODIMENT

Figure 1:
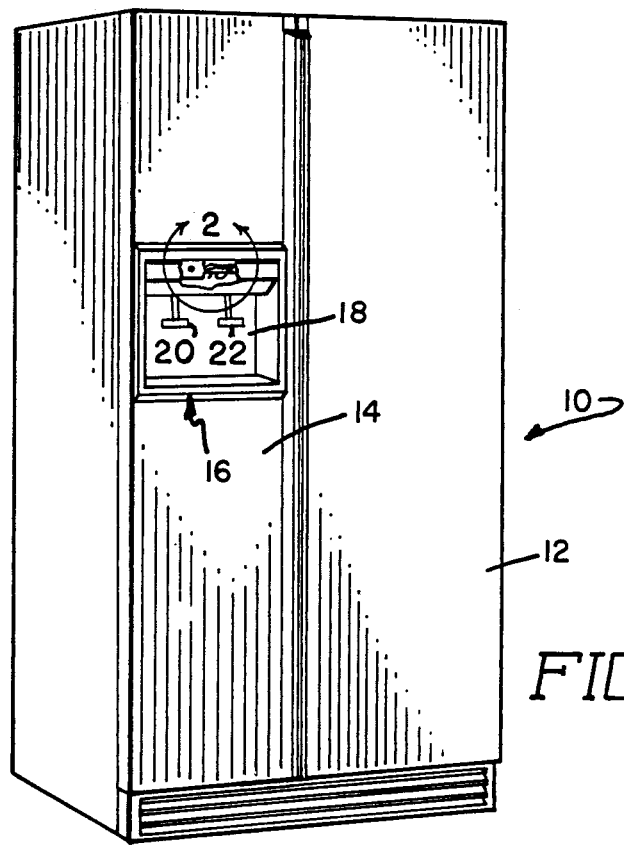
FIG. 1 is a front perspective view of a refrigerator having an ice and water dispenser.

Referring now to the drawings wherein like reference numerals designate identical or corresponding parts throughout the several views, FIG. 1 shows a refrigerator 10, here depicted as a so-called side-by-side refrigerator. Fresh foods are stored on the right side of refrigerator 10 and are accessed using door 12, and frozen foods are stored on the left side and are accessed using door 14.

Positioned in frozen food door 14 is a through-the-door dispenser 16 for ice and water. Internal refrigerator apparatus for dispensing ice and water or other liquids through the door is well known to those skilled in the art, and is not shown or described in detail herein as it is not necessary for an understanding of the invention. For a more complete discussion, see U.S. Pat. No. 3,874,559. For purposes here, it is sufficient to understand that dispenser 16 here includes within door 14 a recess 18 or cavity in which actuators such as levers arms 20 and 22 are positioned. In operation, a glass is inserted into recess 18 and seated against actuator lever arm 20 for ice or actuator lever arm 22 for cold water. The glass is then pushed against the actuator lever arm 20 or 22 urging it to the rear so that the respectively selected ice or water is fed into the glass. More specifically, movement of actuator lever arm 20 to the rear causes an ice chute door (not shown) at the top of recess 18 to open. The movement of actuator lever arm 20 to the rear also actuates internal refrigerator apparatus which feeds ice down the chute into the glass. In the case of cold water, movement of the actuator lever arm 22 causes a valve to open thereby permitting cold water to flow from a storage tank into the glass. Alternately, actuator lever arms 20 and 22 can be replaced by operator actuable switches that activate the mechanical functions of feeding ice or water.

Figure 2:
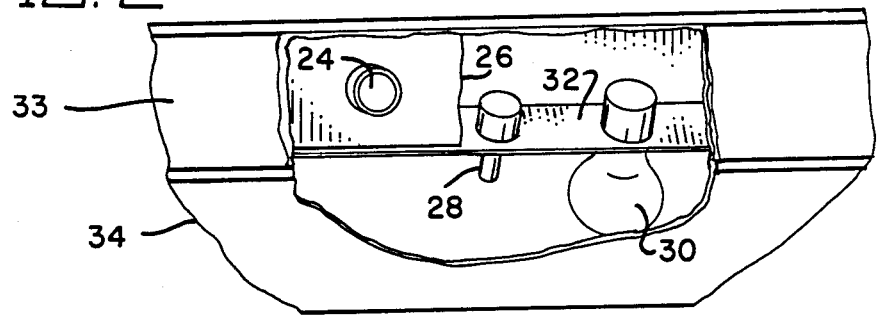
FIG. 2 is an expanded view of the broken-away portion within line 2—2 of FIG. 1.

Referring to FIG. 2, an expanded view of the partially broken away portion within line 2—2 of FIG. 1 shows a photocell 24 or electric eye mounted on bracket 26, and operator actuable switch 28 and light bulb 30 mounted on partition 32. Photocell 24 is positioned behind panel 33 which, at least in front of photocell 24 is made of a light transmissive material such as clear plastic so that ambient light in the room is incident on photocell 24. In other words, photocell 24 senses the ambient light of the room in which refrigerator 10 is located. Light switch 28 and light bulb 30 are preferably obscured from view by canopy 34, but light switch 28 is located so as to easily be switched on or off by reaching through recess 18 and up behind canopy 34. When energized, light bulb 30 illuminates recess 18, but partition 32 isolates light bulb 30 and recess 18 from photocell 24 so that illumination from light bulb 30 is not incident on photocell 24.

Figure 3:
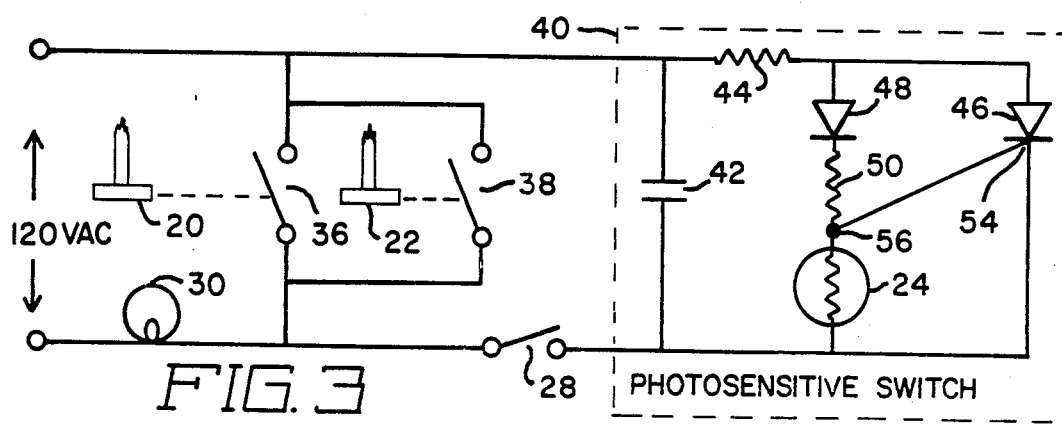
FIG. 3 is a schematic of the control for the light bulb of the ice and water dispenser of FIG. 1.

Referring to FIG. 3, a control circuit for light bulb 30 includes parallel ice dispensing switch 36 and water dispensing switch 38 which are connected in series with 120 volts AC and light bulb 30. Ice dispensing switch 36 is mechanically coupled to ice actuator lever arm 20 or any other suitable apparatus used to activate dispensing of ice such that any time ice is being dispensed, ice dispensing switch 36 is automatically closed thus applying household line voltage or 120 volts AC across light bulb 30. Similarly, water dispensing switch 38 is mechanically coupled to water actuator lever arm 22 or other suitable apparatus used to activate dispensing of water such that any time water is being dispensed, water dispensing switch 38 is automatically closed thus applying household line voltage or 120 volts AC across light bulb 30. Accordingly, when either ice or water is being dispensed, recess 18 is illuminated to maximum brightness so long as the respective actuator lever arm 20 or 22 is depressed.

Photosensitive switch 40 is connected in parallel with ice and water dispensing switches 36 and 38, and also connected in series with operator actuable toggle switch 28, light bulb 30, and 120 volts AC. Thus, when switch 28 is switched to the closed state, photosensitive switch 40 is enabled, and when switch 28 is switched to the open state, photosensitive switch 40 is disabled or inoperative.

The input of photosensitive switch 40 includes capacitor 42 and resistor 44 which provide an interference filter. Resistor 44 has a relatively small resistance, such as, for example, 47 ohms. Silicon controlled rectifier (SCR) 46 is connected in parallel with series diode 48, resistor 50, and photocell 24. The junction 56 between resistor 50 and photocell 24 provide the gate 54 which controls whether SCR 46 is on or off. Photocell 24 is a photoconductive device and operates as a photoresistor or electric eye. That is, when ambient room light is incident on the surface of photocell 24, it has a relatively small resistance and, in darkness when no light is present, it has a relatively high resistance. For example, photocell 24 may typically have an impedance of approximately 3.3K ohms when no foot candles are incident on its surface, but have an impedance of 165K ohms in darkness. Resistor 50 is of relatively high resistance such as, for example, 1.5 megaohms. Accordingly, during the daylight hours when ambient light is incident upon photocell 24, the voltage potential drop across resistor 50 is such that junction 56 is at a relatively low potential such as less than one volt thereby keeping SCR 46 in its normally open state. In such state, light bulb 30 is off unless either ice or water dispensing switches 36 or 38 is closed. When it is dark, however, and there is no light incident upon photocell 24, the current through and thus the voltage drop across resistor 50 is less such that junction 56 becomes more positive and provides a gating signal sufficient to turn on normally open SCR 46. Disregarding the small voltage drop across resistor 44, half wave rectified line voltage or 120 volts DC is applied across light bulb 30 when SCR 46 is gated closed. In short, photosensitive switch 40 operates as an automatic night light when switch 28 is closed thereby turning light bulb 30 automatically on at night at reduced line voltage, and off all together during the day. The resistance of resistor 50 and the operating characteristics of photocell 24 and SCR 46 are suitably selected so that at dusk, SCR 46 will turn light bulb 30 on at the appropriate level of darkness, and at dawn, SCR 46 will turn light bulb 30 off at the appropriate level of daylight.

In summary, when operator actuable switch 28 is left open, photosensitive switch 40 is disabled and light bulb 30 is illuminated only when ice dispensing switch 36 or water dispensing switch 38 are closed by the manual action of dispensing ice or water. When operator actuable switch 28 is set to the closed position, however, photosensitive switch 40 is enabled. In this condition, when ambient room light is removed from photocell 24 such as at night, SCR 46 is gated on and half wave rectified line voltage or 120 volts DC is applied across light bulb 30 thus illuminating it to an intensity level which is less than with 120 volts AC. If ice or water is dispensed in this condition thus closing ice or water dispensing switches 36 or 38, 120 volts AC is applied to light bulb 30 and it brightens thus giving an illusion of a light bulb having low/high or dim/bright filaments. When daylight comes, SCR 46 is automatically gated off as light is incident on photocell 24, and the half wave rectified line voltage is removed from light bulb 30 thus turning it off.

It has been found that in accordance with the light bulb control as shown in FIG. 3, and described heretofore, the mean-life-to-failure (MLTF) of light bulbs has greatly improved over prior art dispensers that had manual switches for the light bulb. First of all, by using photosensitive switch 40 such that light bulb 30 is automatically turned off when ambient light is present, light bulb 30 is generally off during the day rather than intentionally or inadvertently being left on continuously. For example, light bulb 30 may only be on for twelve hours a day rather than 24 and, at the same time, the feature of having the light bulb on at night is automatically provided. Secondly, during the dark hours when light bulb 30 is on, it is energized by half wave rectified line voltage or 120 volts DC. This voltage, which is less than line voltage which is typically used, significantly reduces the filament temperature and thereby provides extended life. For example, the filament of a typical dispenser light bulb may operate at 2200° K. when operating with 120 volts AC, but it has been estimated that with half wave rectified line voltage, the temperature is reduced to approximately 1300° K. It is understood that factors other than temperature such as the on-off vibration of the filament also determine the life of a light bulb. However, it is estimated that as compared with a continuously lighted bulb, photosensitive switch 40 may typically increase the mean-life-to-failure from a few months to several years.

This completes the Description of the Preferred Embodiment. However, a reading of it by those skilled in the art will bring to mind many alterations and modifications without departing from the spirit and scope of the invention. Accordingly, it is intended that the scope of the invention be limited only by the appended claims.

What is claimed is:

1. In a refrigerator having a door with a recess for dispensing water, ice or the like through the door, and the recess includes a dispensing actuator and a light bulb for illuminating the recess, a light bulb control comprising:
   first switch means responsive to the absence of ambient light for automatically energizing said light bulb; and
   second switch means responsive to said actuator for energizing said light bulb when ice or water is being dispensed.

2. The light bulb control recited in claim 1 wherein said first switch means comprises a photosensitive switch.

3. The light bulb control recited in claim 1 wherein said first switch means comprises an SCR.

4. The light bulb control recited in claim 1 further comprising third switch means for disabling said second switch means.

5. In a refrigerator having a door with a recess for dispensing water, ice or the like through the door, and the recess includes a dispensing actuator and a light bulb for illuminating the recess, a light bulb control comprising:
   first switch means for energizing said light bulb with half wave rectified line voltage;
   second switch means in parallel with said first switch means and responsive to said actuator for energizing said light bulb with line voltage wherein, when said first switch means is closed so that said light bulb is illuminated at a first intensity and said second switch is activated, the intensity of said light bulb is brightened by applying said line voltage.

6. In a refrigerator having a through the door dispenser with a door recess including a dispensing actuator and a light bulb for illuminating the recess, a light bulb control comprising:
   first switch means responsive to said actuator for applying line voltage across said light bulb; and
   second switch means for applying half wave rectified line voltage across said light bulb, said second switch means comprising photosensitive means for closing said second switch in ambient darkness.

7. The light bulb recited in claim 6 wherein said second switch means comprises an SCR.

8. The light bulb recited in claim 6 further comprising a third operator actuable switch means for disabling said second switch means.

* * * * *